(12) United States Patent
Rouh et al.

(10) Patent No.: US 7,939,418 B2
(45) Date of Patent: May 10, 2011

(54) PARTIAL IMPLANTATION METHOD FOR SEMICONDUCTOR MANUFACTURING

(75) Inventors: Kyoung Bong Rouh, Goyang-si (KR); Yong-sun Sohn, Seongnam-si (KR); Min Yong Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 15 days.

(21) Appl. No.: 12/646,196

(22) Filed: Dec. 23, 2009

(65) Prior Publication Data

US 2010/0099244 A1 Apr. 22, 2010

Related U.S. Application Data

(62) Division of application No. 11/197,091, filed on Aug. 4, 2005, now Pat. No. 7,662,705.

(30) Foreign Application Priority Data

Mar. 17, 2005 (KR) .................................. 2005-22446

(51) Int. Cl.
*H01L 21/00* (2006.01)
*H01L 21/331* (2006.01)
*H01L 21/425* (2006.01)

(52) U.S. Cl. ........ 438/369; 438/506; 438/514; 438/527; 257/E21.334; 257/E21.336; 257/E21.337

(58) Field of Classification Search .................. 438/369, 438/506, 514, 527; 257/E21.334, E21.336, 257/E21.337

See application file for complete search history.

(56) References Cited

U.S. PATENT DOCUMENTS

| 5,281,542 A | * | 1/1994 | Hui et al. ........................ 438/94 |
| 6,005,272 A | | 12/1999 | Gardner et al. |
| 6,027,989 A | | 2/2000 | Poole et al. |
| 6,037,629 A | | 3/2000 | Gardner et al. |

(Continued)

FOREIGN PATENT DOCUMENTS

CN 1564313 A 1/2005

(Continued)

*Primary Examiner* — Walter L Lindsay, Jr.
*Assistant Examiner* — Ron Pompey
(74) *Attorney, Agent, or Firm* — Marshall, Gerstein & Borun LLP

(57) ABSTRACT

Disclosed herein is a partial implantation method for manufacturing semiconductor devices. The method involves implantation of dopant ions at different densities into a plurality of wafer regions, including first and second regions, defined in a wafer by means of a boundary line. In the method, first, second and third implantation zones are defined. The first implantation zone is the remaining part of the first region except for a specific part of the first region close to the boundary line, the second implantation zone is the remaining part of the second region except for a specific part of the second region close to the boundary line, and the third implantation zone is the remaining part of the wafer except for the first and second implantation zones. Then, dopant ions are implanted into the first implantation zone at a first density, into the second implantation zone at a second density different from the first density, and into the third implantation zone at a third density that is a midway value between the first and second densities.

7 Claims, 12 Drawing Sheets

U.S. PATENT DOCUMENTS

| | | | |
|---|---|---|---|
| 6,049,481 A | 4/2000 | Yamasaki | |
| 6,229,148 B1 | 5/2001 | Prall et al. | |
| 6,255,178 B1 | 7/2001 | Brown et al. | |
| 7,105,839 B2 | 9/2006 | White | |
| 7,365,406 B2 * | 4/2008 | Rouh et al. | 257/428 |
| 2002/0005553 A1 | 1/2002 | Ootsuka et al. | |
| 2002/0185686 A1 | 12/2002 | Christiansen et al. | |
| 2007/0023696 A1 * | 2/2007 | Lee | 250/492.21 |
| 2007/0082450 A1 | 4/2007 | Van Dal et al. | |

FOREIGN PATENT DOCUMENTS

| | | |
|---|---|---|
| CN | 1868046 A | 11/2006 |
| JP | 2002-170515 | 6/2002 |
| KP | 10-2003-0035946 | 5/2003 |
| KP | 10-2005-0083538 | 8/2005 |
| WO | WO-2005/038900 | 4/2005 |

* cited by examiner

PARTIAL IMPLANTATION METHOD FOR SEMICONDUCTOR MANUFACTURING

CROSS-REFERENCE TO RELATED APPLICATIONS

This is a division of U.S. application Ser. No. 11/197,091 filed Aug. 4, 2005, which claims the priority benefit under 35 U.S.C. §119 of KR 2005-22446, filed Mar. 17, 2005, the entire respective disclosures of which are incorporated herein by reference.

BACKGROUND

1. Technical Field

Methods for manufacturing semiconductor devices which include partial implantation techniques are disclosed.

2. Description of the Related Art

Generally, methods for manufacturing semiconductor memory devices, such as dynamic random access memory (DRAM), consist of several unit processes. The unit processes include deposition, etching, and implantation processes, etc., and are conventionally performed on a wafer-by-wafer basis. However, uniform process results are difficult to achieve. For example, uniform thicknesses of the stacked layers and etching ratios and uniform density of ions as throughout the area of the wafer are difficult to obtain because it is impossible to accurately control the large number of variables associated with the unit processes. Therefore, it can be said that process errors due to unpredictable or inaccurately controlled process variables are an inherent aspect of semiconductor device manufacturing.

As expected, process errors ultimately deteriorate the characteristics of semiconductor devices to be manufactured. As an example, transistors often fail to maintain a uniform threshold voltage throughout the wafer. Even if the threshold voltage is adjusted to be uniform throughout the wafer via the implementation of an ion implantation process prior to forming a gate stack, the threshold voltage can become non-uniform during subsequent processes, resulting in uneven distribution of the threshold voltage throughout the wafer.

In a subsequent formation of a gate insulation layer, an oxide layer as the gate insulation layer is formed in a non-uniform thickness throughout the wafer. This makes it impossible to achieve a uniform threshold voltage distribution throughout the wafer even if the ion implantation process is performed to impart the wafer with a uniform threshold voltage.

Further, when source/drain regions having lightly doped drain (LDD) structures are formed, low-density ions are first implanted after formation of the gate stack, forming source/drain extension regions. Subsequently, a gate spacer is formed at the side wall of the gate stack, and then, high-density ions are implanted to form deep source/drain regions. However, there are problems in that the oxide layer and nitride layer of the gate spacer are stacked at a non-uniform thickness throughout the wafer, and that it is impossible to achieve a uniform etching ratio even when using an etch-back process. Thus, the gate spacer exhibits an uneven thickness on the wafer. When the gate spacer is used as an ion implantation mask to form the deep source/drain regions, furthermore, it inevitably adversely affects the threshold voltage in parts of the wafer.

To solve the uneven distribution problem of the threshold voltage caused by non-uniform process results described above, a partial implantation method has been proposed. The partial implantation method is a method of implanting ions, that act as impurities, namely, dopant providing a threshold voltage adjustment, into respective regions of a wafer at varying densities in consideration of variations in the threshold voltage in subsequent processes.

FIG. 1 is a diagram illustrating a conventional partial implantation method. A wafer 100 is divided into a plurality of regions according to the density of dopant ions to be implanted thereto. More specifically, based on a boundary line 110 crossing the center thereof, the wafer 100 is divided into an upper region 120 at the upper side of the boundary line 110 and a lower region 130 at the lower side of the boundary line 110. Here, it should be understood that the terms "upper" and "lower" are used for easy explanation of the wafer structure with reference to FIG. 1, and are not intended to limit the positional relationship therebetween.

It will be understood that the wafer may be divided into three or more regions as occasion demands. Ions having different densities, in consideration of the threshold voltage variation in subsequent processes, are implanted to the respective divided regions, namely, the upper and lower regions 120 and 130. For example, when it is expected that the threshold voltage of the upper region 120 will be lowered during subsequent processes, dopant ions are implanted at a relatively lower density than the normal density of ions that are implanted in a general implantation process by approximately 5%, thereby increasing the threshold voltage of the upper region 120. Conversely, when it is expected that the threshold voltage of the lower region 130 will be increased during subsequent processes, dopant ions are implanted at a relatively higher density than the normal density by approximately 5%, thereby lowering the threshold voltage of the lower region 130. This enables both the upper and lower regions 120 and 130 of the wafer 100 to achieve a uniform threshold voltage distribution in spite of such a threshold voltage variation in subsequent processes.

FIG. 2 is a graph illustrating the density distribution of dopant ions implanted by the conventional partial implantation method. The abscissa of the graph represents the length of the wafer 100 measured along the line II-II' that intersects the boundary line 110 of the wafer 100. The origin of the abscissa indicates one point on the perimeter of the circular wafer 100, and the right end of the abscissa indicates the opposite point on the perimeter of the wafer 100 that is shown as a flat zone in FIG. 1. Further, a dashed line 110a indicates the boundary line 110 of FIG. 1. A region at the left side of the dashed line 110a indicates the upper region 120 of the wafer 100, and a region at the right side of the dashed line 110a indicates the lower region 130 of the wafer 100. The ordinate of the graph represents a therma-wave (TW) signal, which is proportional to the density of the dopant ions implanted in a wafer. Thus, the density distribution of the dopant ions implanted in the wafer 100 can be recognized by measuring the therma-wave signal. From the description as stated above with reference to FIG. 1, it can be clearly understood that the density of the dopant ions implanted in the upper region 120 of the wafer 100 is relatively low and the density of the dopant ions implanted in the lower region 130 of the wafer 100 is relatively high.

Although the conventional partial implantation method as stated above can eliminate the non-uniformity of the threshold voltage throughout the respective regions of the wafer to some extent, it has a limitation when adjusting the density of dopant ions at a boundary line between the respective regions. That is, it is difficult to adjust the density of dopant ions in the vicinity of the boundary line 110 of the wafer 100 shown in FIG. 1. As is clearly illustrated in the graph of FIG. 2, the density of the dopant ions is not constant in the vicinity of the boundary line 110, but increases gradually from the upper region 120 to the lower region 130. The slope of the density is represented as a dotted line 200 in the vicinity of the dashed line 110a of the graph of FIG. 2 corresponding to the boundary line 110 of the wafer 100. The dotted line 200 is determined based solely upon the density of dopant ions implanted in the wafer 100, and cannot be freely adjusted. As will be easily understood, the slope of the dotted line 200 should be high in the vicinity of the boundary line 110 in order to achieve a wide difference between the characteristics of transistors in the respective regions divided by the boundary line 110. Conversely, when it is desired to narrow the differences between the characteristics of the transistors, the slope of the dotted line 200 should be low in the vicinity of the boundary line 110. However, the conventional partial implantation method cannot provide free adjustment of the slope of the dotted line 200, namely, the density of the dopant ions.

SUMMARY OF THE DISCLOSURE

In view of the above problems, a partial implantation method is disclosed which can allow free adjustment in the density distribution of the dopant ions implanted in the vicinity of a boundary line, which can divide a wafer into a plurality of regions in correspondence to the physical characteristics of the semiconductor devices being manufactured.

A disclosed partial implantation method to implant dopant ions at different densities into a plurality of regions, including first and second regions defined in a wafer by means of a boundary line, comprises: defining a first implantation zone that is a remaining part of the first region except for a specific part of the first region close to the boundary line, a second implantation zone that is the remaining part of the second region except for a specific part of the second region close to the boundary line, and a third implantation zone that is the remaining part of the wafer except for the first and second implantation zones; and implanting the dopant ions at a first density into the first implantation zone, at a second density different from the first density into the second implantation zone, and at a third density that is a middle value between the first and second densities into the third implantation zone.

Preferably, the first implantation zone may have an area corresponding to less than half or more preferably about 98% of the area of the first region.

Preferably, the second implantation zone may have an area corresponding to less than half or more preferably about 98% of the area of the second region.

Preferably, the first density of the dopant ions implanted in the first implantation zone may be lower than the third density of the dopant ions implanted in the third implantation zone, and the second density of the dopant ions implanted in the second implantation zone may be higher than the third density of the dopant ions implanted in the third implantation zone.

Preferably, the first density may be lower than the third density by about 5%, and the second density may be higher than the third density by about 5%.

Preferably, the boundary line between the first and second regions may be formed to vertically or horizontally bisect the wafer.

Preferably, the boundary line between the first and second regions may be formed to divide the wafer into a center region and a peripheral region.

Another disclosed partial implantation method to implant dopant ions at different densities into a center region and a peripheral region defined in a wafer by means of a circular boundary line, comprises: defining a first region at the upper side of a horizontal line as a tangent line of the circular boundary line and a second region at the lower side of the horizontal line; implanting dopant ions at a first density into a first implantation zone that is the remaining part of the first region except for a specific part of the first region close to the horizontal line, at a second density different from the first density into a second implantation zone that is the remaining part of the second region except for a specific part of the second region close to the horizontal line, and at a third density that is a middle value between the first and second densities into a third implantation zone that is the remaining part of the wafer except for the first and second implantation zones; and repeatedly implanting the ions while intermittently rotating the wafer within an angular range of 360°.

Preferably, the repeated implanting of the ions while intermittently rotating the wafer may be performed until the wafer is rotated beyond at least the angular range of 360°.

Preferably, the wafer may be intermittently rotated by an angle less than 180° during the implantation of the dopant ions.

Preferably, the first implantation zone may have an area corresponding to about 98% of the area of the first region.

Preferably, the second implantation zone may have an area corresponding to about 98% of the area of the second region.

Preferably, the first density of the dopant ions implanted in the first implantation zone may be lower than the third density of the dopant ions implanted in the third implantation zone, and the second density of the dopant ions implanted in the second implantation zone may be higher than the third density of the dopant ions implanted in the third implantation zone.

Preferably, the first density may be lower than the third density by about 5%, and the second density may be higher than the third density by about 5%.

Another partial implantation method to implant dopant ions at different densities into a plurality of regions, including first and second regions defined in a wafer by means of a boundary line, comprises: defining a first implantation zone occupying part of the first region and a specific part of the second region close to the boundary line, and a second implantation zone equal to the second region; and implanting dopant ions at a first density into the first implantation zone, and at a second density different from the first density into the second implantation zone.

Preferably, the first implantation zone may have an area corresponding to about 110% of the area of the first region.

Preferably, the first density of the dopant ions implanted in the first implantation zone may be lower than the second density of the dopant ions implanted in the second implantation zone.

Preferably, the first density may be lower than the second density by about 5%.

Preferably, the first density of the dopant ions implanted in the first implantation zone may be higher than the second density of the dopant ions implanted in the second implantation zone.

Preferably, the first density may be higher than the second density by about 5%.

Another partial implantation method to implant dopant ions at different densities into a center region and a peripheral region defined in a wafer by means of a circular boundary line, comprises: defining a first region at the upper side of a horizontal line as a tangent line of the circular boundary line and a second region at the lower side of the horizontal line; defining a first implantation zone occupying part of the first region and a specific part of the second region close to the boundary line, and a second implantation zone equal to the second region; implanting dopant ions at a first density into the first implantation zone, and at a second density different from the first density into the second implantation zone; and repeatedly implanting the ions while intermittently rotating the wafer within an angular range of 360°.

Preferably, the repeated implanting of the ions while intermittently rotating the wafer may be performed until the wafer is rotated beyond at least the angular range of 360°.

Preferably, the wafer may be intermittently rotated by an angle less than 180° during the implantation of the dopant ions.

Preferably, the first implantation zone may have an area corresponding to about 110% of the area of the first region.

Preferably, the first density of the dopant ions implanted in the first implantation zone may be lower than the second density of the dopant ions implanted in the second implantation zone.

Preferably, the first density of the dopant ions implanted in the first implantation zone may be higher than the second density of the dopant ions implanted in the second implantation zone.

BRIEF DESCRIPTION OF THE DRAWINGS

The above and other features and advantages of the disclosed methods will be more clearly understood from the following detailed description taken in conjunction with the accompanying drawings, wherein.

DESCRIPTION OF THE PRESENTLY PREFERRED EMBODIMENTS

In the following description, it should be understood that the terms "upper" and "lower" are used for easy explanation of the wafer structure with reference to the accompanying drawings, and are not intended to limit positional relationship therebetween.

Figure 1:
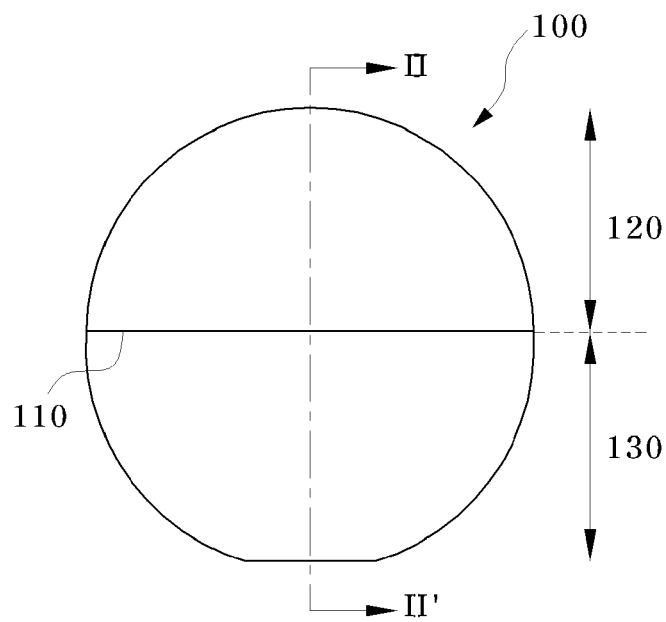
FIG. 1 is a diagram explaining a conventional partial implantation method.
Figure 3:
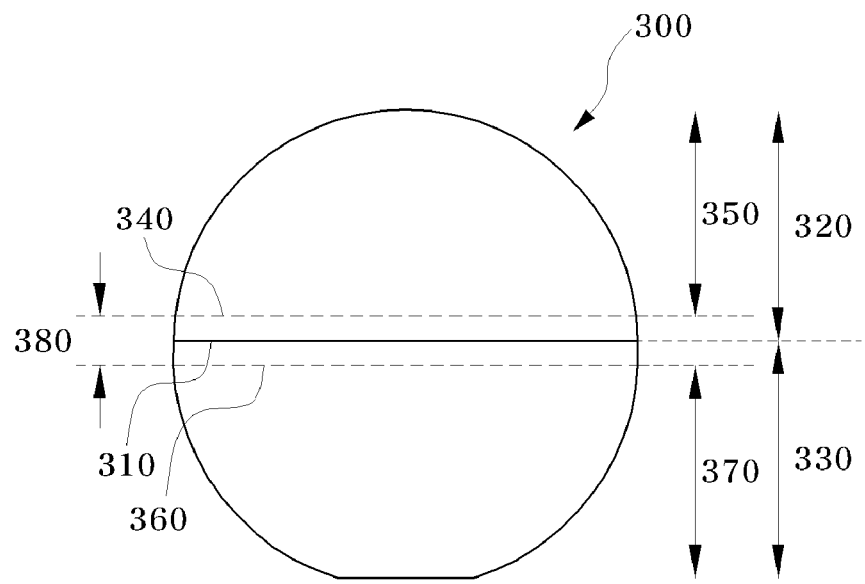
FIG. 3 is a diagram explaining a partial implantation method according to a first disclosed method.

FIG. 3 is a diagram explaining a partial implantation method according to a first disclosed method. A wafer 300 is divided into a plurality of regions according to the density of dopant ions to be implanted thereto. More specifically, based on a boundary line 310 crossing the center thereof, the wafer 300 is divided into a first region 320 at the upper side of the boundary line 310 and a second region 330 at the lower side of the boundary line 310. Of course, it will be naturally understood that the present embodiment bisects the wafer 300 into the first and second regions 320 and 330 based on the boundary line 310 crossing the center of the wafer 300, but it is only for exemplary, and the boundary line 310 is displaceable upward or downward as occasion demands. Alternatively, the boundary line 310 may extend in a vertical direction rather than a horizontal direction shown in FIG. 1, or may be inclined obliquely.

After the wafer 300 is divided into the first and second regions 320 and 330, a first implantation zone 350 is defined in part of the first region 320. The first implantation zone 350 has an area determined by the density distribution of dopant ions implanted in a specific part of the first region 320 close to the boundary line 310. In the present embodiment, the area of the first implantation zone 350 is approximately 98% of the area of the first region 320. Here, the remaining area of the first region 320 corresponds to the specific part close to the boundary line 310. More specifically, based on dashed line 340 located above the boundary line 310, the first region 320 is divided into a zone close to the boundary line 310 at the lower side of dashed line 340, and a zone spaced apart from the boundary line 310 at the upper side of the dashed line 340. The zone, spaced apart from the boundary line 310 at the upper side of the dashed line 340, is used as the first implantation zone 350.

Similarly, a second implantation zone 370 is defined in part of the second region 330. The second implantation zone 370 has an area determined by the density distribution of dopant ions implanted in a specific part of the second region 330 close to the boundary line 310. In the present embodiment, the area of the second implantation zone 370 is approximately 98% of the area of the second region 330. Here, the remaining area of the second region 330 corresponds to the specific part close to the boundary line 310. More specifically, based on dashed line 360 located at the lower side of the boundary line 310, the second region 330 is divided into a zone close to the boundary line 310 at the upper side of dashed line 360, and a zone spaced apart from boundary line 310 at the lower side of dotted line 360. The zone, spaced apart from the boundary line 310 at the lower side of dashed line 360, is used as the second implantation zone 370.

The remaining part of the wafer 300 close to the boundary line 310 except for the first and second implantation zones 350 and 370 defines a third implantation zone 380. That is, the third implantation zone 380 extends from the boundary line 310 by predetermined distances in the first and second regions 320 and 330.

After the first and second implantation zones 350 and 370, that are defined by excluding the specific parts close to the boundary line 310, and the third implantation zone 380, as the excluded part, are defined based on the boundary line 310, an ion implantation process for threshold voltage adjustment is performed on the first, second and third implantation zones 350, 370 and 380 by means of an ion implantation mask. Conventionally, the ion implantation process is sequentially performed on the first, second and third implantation zones 350, 370 and 380. In the present embodiment, dopant ions are implanted in the third implantation zone 380 at a normal density, while dopant ions are implanted in the first and second implantation zones 350 and 370 at different densities lower and higher than the normal density, respectively. Here, the normal density of the dopant ions implanted in the third implantation zone 380 corresponds to a density of the dopant ions to be implanted in the case of a general implantation process rather than a partial implantation.

As an example of the ion implantation process for threshold voltage adjustment, when it is desired to increase the threshold voltage of the first region 320 beyond a predetermined level and to lower a threshold voltage of the second region 330 below a predetermined level, it is necessary for the first region 320 to compensate for the lowering of the threshold voltage thereof in subsequent processes, while it is necessary for the second region 330 to compensate for the increase of the threshold voltage thereof in the subsequent processes. For this, the density of the dopant ions implanted in the first implantation zone 350 must be lower than the normal density of the dopant ions implanted in the third implantation zone 380. Conversely, the density of the dopant ions implanted in the second implantation zone 370 must be higher than the normal density of the dopant ions implanted in the third implantation zone 380. More specifically, although the density of dopant ions to be implanted may be varied depending on the desired threshold voltage value, the density of dopant ions to be implanted in the first implantation zone 350 is determined to be lower than the density of the dopant ions to be implanted in the third implantation zone 380 by approximately 5%, while the density of the dopant ions to be implanted in the second implantation zone 370 is determined to be higher than the density of the dopant ions to be implanted in the third implantation zone 380 by approximately 5%. By performing the ion implantation process using a partial implantation method described above, the density distribution of the dopant ions in the vicinity of the boundary line 310 can be adjusted by varying at least one of the areas of the first and second implantation zones 350 and 370.

Figure 4:
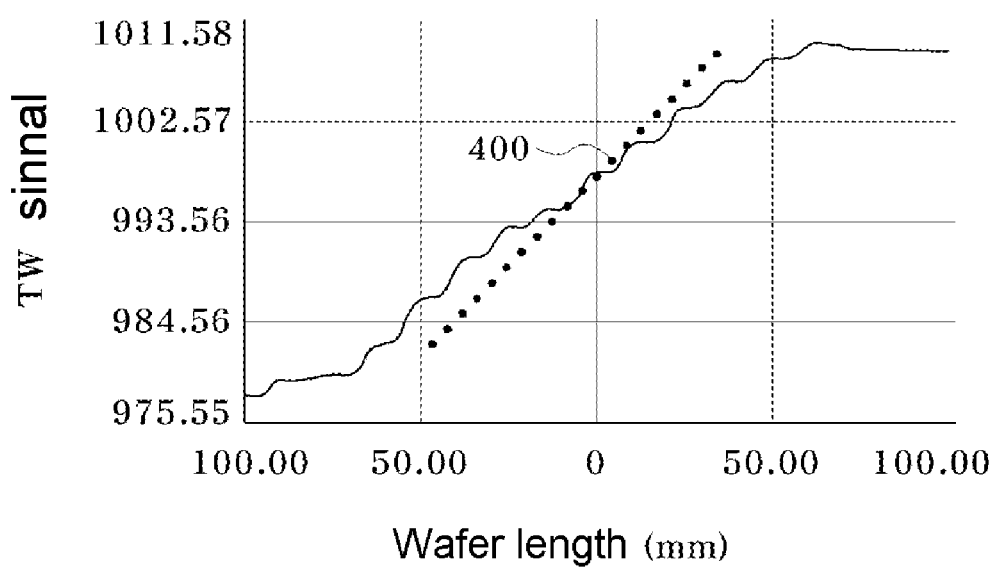
FIG. 4 is a graph illustrating the density distribution of dopant ions implanted by a partial implantation method according to the first disclosed method.

FIG. 4 is a graph illustrating the density distribution of dopant ions implanted by the partial implantation method according to the first disclosed method. The abscissa of the graph represents the length of the wafer 300 measured along a line that intersects the boundary line 310 of the wafer 300. A zero value at the center of the abscissa corresponds to the boundary line 310 of the wafer 300, and the left and right sides of the zero value indicate the first and second regions 320 and 330 of the wafer 300, respectively. The ordinate of the graph represents a therma-wave (TW) signal, which is proportional to the density of the dopant ions implanted in the wafer 300.

Figure 2:
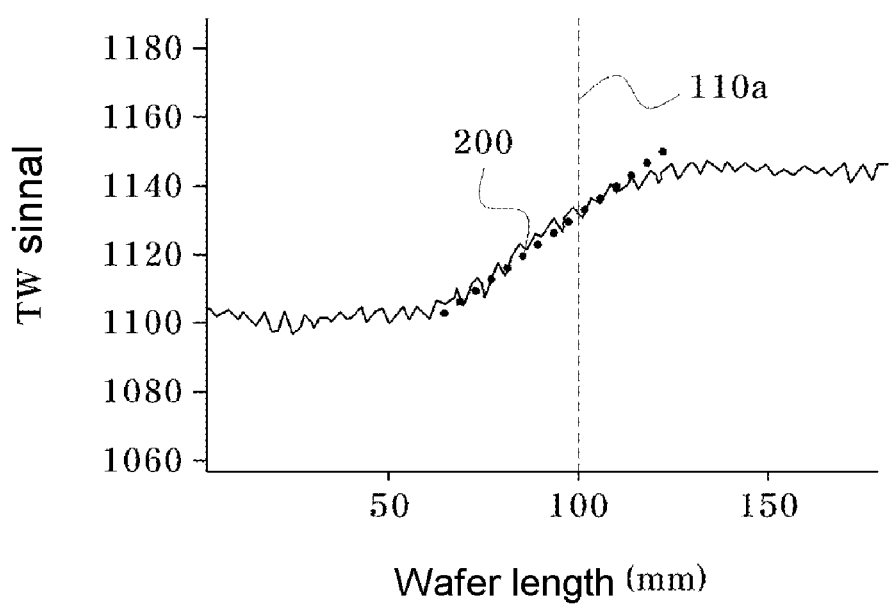
FIG. 2 is a graph illustrating the density distribution of dopant ions implanted by a conventional partial implantation method.

As shown in FIG. 4, as a result of implanting the dopant ions using the partial implantation method of FIG. 3, it can be found that the density of the dopant ions in the vicinity of the boundary line 310 of the wafer 300 rapidly varies as compared to a conventional partial implantation method shown in FIG. 2. That is, the slope of a dotted line 400, that represents the density distribution of the dopant ions in the vicinity of the boundary line 310, is high. The slope of the dotted line 400 can be adjusted by varying at least one of the areas of the first and second implantation zones 350 and 370. For example, when it is desired to increase the slope of the dotted line 400, at least one of the areas of the first and second implantation zones 350 and 370 is increased by displacing at least one of the dashed lines 340 and 360, that define borders of the first and second implantation zones 350 and 370, toward the boundary line 310. Conversely, when it is desired to decrease the slope of the dotted line 400, at least one of the areas of the first and second implantation zones 350 and 370 is reduced by displacing at least one of the dashed lines 340 and 360 far away from the boundary line 310.

Figure 5:
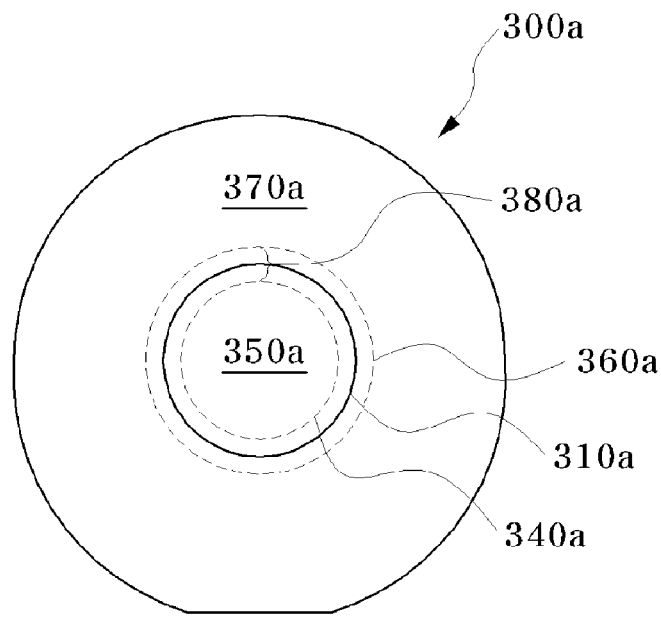
FIG. 5 is a diagram explaining an alternative partial implantation method of the first disclosed method.

FIG. 5 is a diagram explaining an alternative partial implantation method of the first disclosed method.

In contrast to the disclosed method described with reference to FIG. 3, a wafer 300a is divided into first and second regions based on a circular boundary line 310a. That is, the first region is a center region of the wafer 300a inside the circular boundary line 310a, and the second region is a peripheral region of the wafer 300a outside the circular boundary line 310a. In this case, a first implantation zone 350a is defined inside a circular dashed line 340a displaced inward by a predetermined distance from the boundary line 310a, and a second implantation zone 370a is defined outside a circular dashed line 360a displaced outward by a predetermined distance from the boundary line 310a. A zone between the first and second implantation zones 350a and 370a is a third implantation zone 380a. Except for the above difference, the alternative embodiment described above is similar to the first embodiment of FIG. 3, and thus a detailed description thereof will be omitted for conciseness.

FIGS. 6a to 6d are diagrams explaining a partial implantation method according to a second disclosed method. The partial implantation method involves implantation of ions several times while rotating a wafer 600. First, the wafer 600 is divided into a plurality of regions according to the density of the dopant ions to be implanted thereto. In the present embodiment, the wafer 600 is divided into first and second regions based on a circular boundary line 610. The first region of the wafer 600 is a peripheral region 620 outside the boundary line 610, and the second region of the wafer 600 is a center region 630 inside the boundary line 610.

Next, the wafer 600 is oriented to a standard position. The standard position is that shown in FIG. 6, wherein a flat zone 601 of the wafer 600 is at the lowermost position of the wafer. In such an orientation, a first implantation zone 650 is defined at the upper side of a first dashed line 640 that is displaced upward from a standard dashed line 610a as a tangent line of the circular boundary line 610 by a predetermined distance parallel thereto. The area of the first implantation zone 650 can be determined to be approximately 98% of the area of a region at the upper side of the first dashed line 640. Similarly, a second implantation zone 670 is defined at the lower side of a second dashed line 660 that is displaced downward from the standard dashed line 610a as the tangent line of the circular boundary line 610 by a predetermined distance in parallel. The area of the second implantation zone 670 can also be determined to be approximately 98% of the area of a region at the lower side of the second dashed line 660. In this case, the remaining part of the wafer 600 close to the standard dashed line 610a except for the first and second implantation zones 650 and 670 defines a third implantation zone 680. That is, the third implantation zone 680 extends from the standard dashed line 610a by predetermined distances in the first and second regions 640.

After the first, second and third implantation zones 650, 670 and 680 are defined, a primary ion implantation process for threshold voltage adjustment is sequentially performed on the first, second, and third implantation zones 650, 670, and 680 by means of an ion implantation mask. In this case, dopant ions are implanted in the third implantation zone 680 at a normal density, while dopant ions are implanted in the first and second implantation zones 650 and 670 at different densities higher and lower than the normal density, respectively. Here, the normal density of the ions implanted in the third implantation zone 680 corresponds to the density of dopant ions to be implanted in the case of a general implantation process rather than the partial implantation process.

As an example of the ion implantation process for threshold voltage adjustment, when it is desired to increase a threshold voltage of the first region 620 beyond a predetermined level and to lower a threshold voltage of the second region 630 below a predetermined level, it is necessary for the first region 620 to compensate for the lowering of the threshold voltage thereof in subsequent processes, while it is necessary for the second region 630 to compensate for the increase of the threshold voltage thereof in the subsequent processes. For this, the density of the dopant ions implanted in the first implantation zone 650 must be lower than the normal density of the dopant ions implanted in the third implantation zone 680. Conversely, the density of the dopant ions implanted in the second implantation zone 670 must be higher than the normal density of the dopant ions implanted in the third implantation zone 680. More specifically, although the density of dopant ions to be implanted may be varied depending on the desired threshold voltage value, the density of the dopant ions to be implanted in the first implantation zone 650 is determined to be lower than the density of the dopant ions to be implanted in the third implantation zone 680 by approximately 5%, while the density of the dopant ions to be implanted in the second implantation zone 670 is determined to be higher than the density of the dopant ions to be implanted in the third implantation zone 680 by approximately 5%.

Figure 6A:
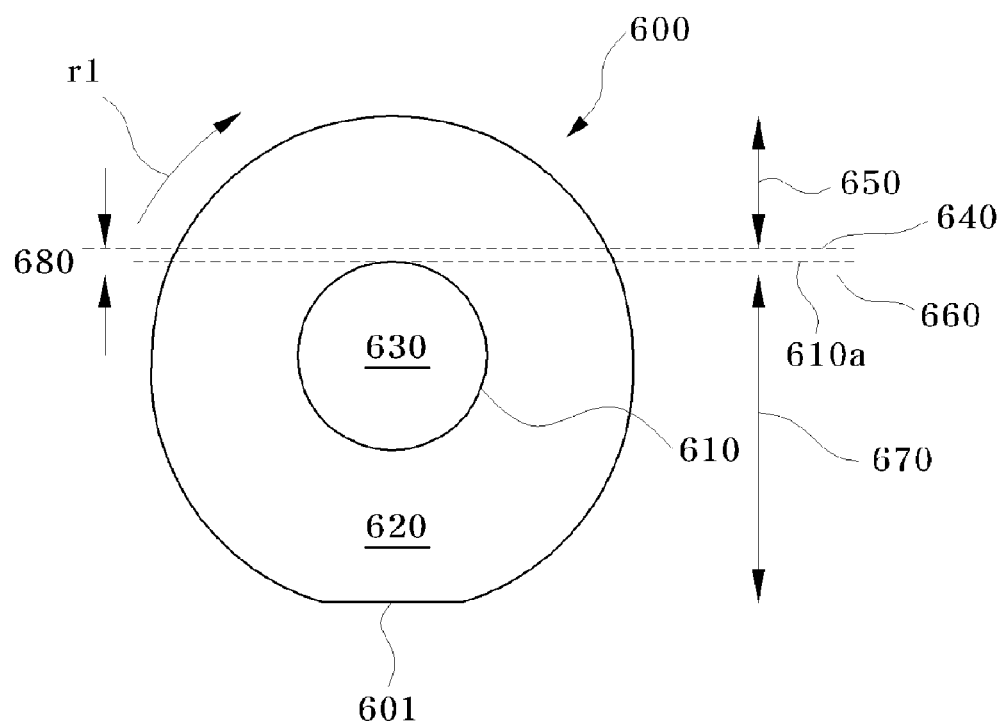
FIGS. 6a to 6d are diagrams explaining a partial implantation method according to a second disclosed method.
Figure 6B:
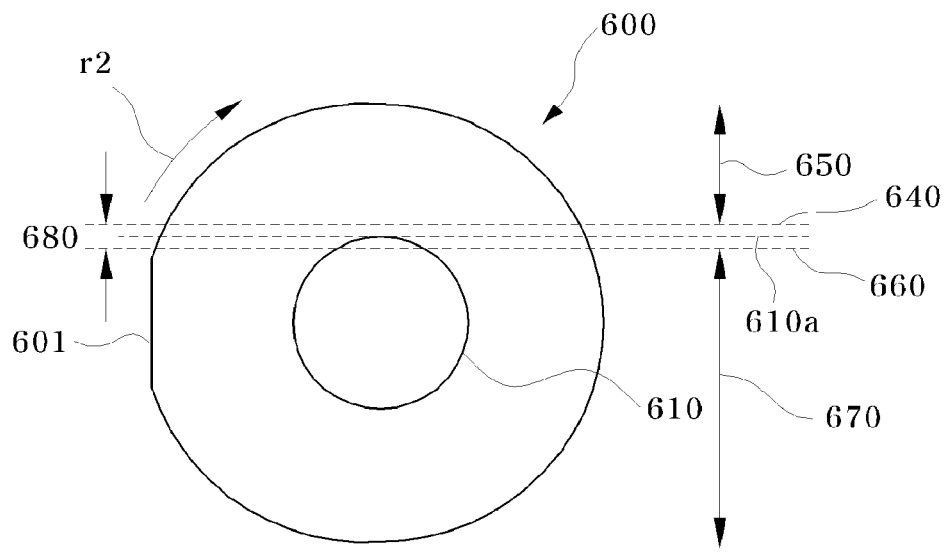

Referring to FIG. 6b, after completing the primary ion implantation process, the wafer 600 is rotated 90° clockwise (designated by arrow r2 on FIG. 6b and r1 in FIG. 6a), causing the flat zone 601 to be at the leftmost position of the wafer 600. In such an orientation, a secondary ion implantation process is performed under the same process conditions as the primary ion implantation process. That is, dopant ions are sequentially implanted in the first, second, and third implantation zones 650, 670 and 680. The density of the dopant ions to be implanted in the first implantation zone 650 is determined to be lower than the normal density of the dopant ions to be implanted in the third implantation zone 680 by approximately 5%, while the density of the dopant ions to be implanted in the second implantation zone 670 is determined to be higher than the normal density of the dopant ions to be implanted in the third implantation zone 680 by approximately 5%.

Figure 6C:
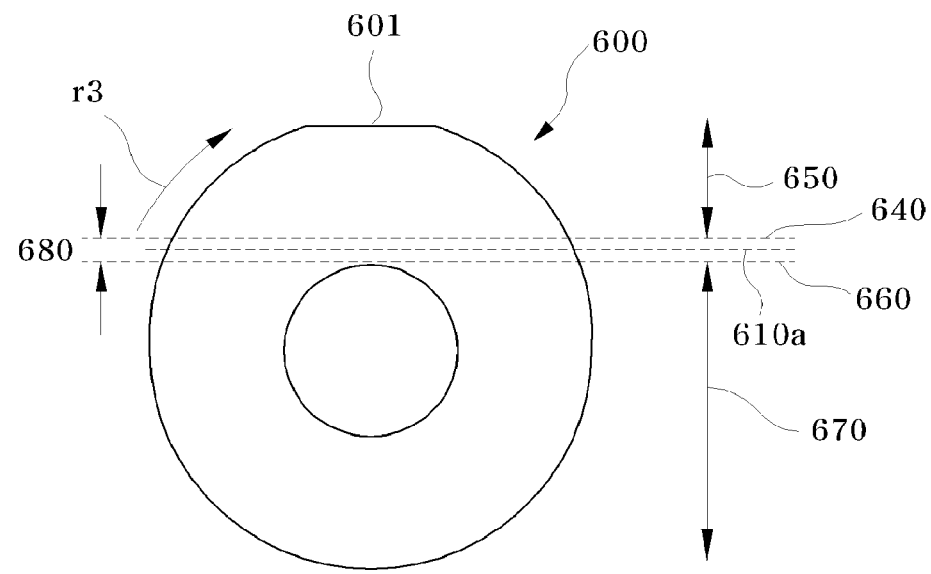

Referring to FIG. 6c, after completing the secondary ion implantation process, the wafer 600 is rotated 90° clockwise (designated by arrow r2 of FIG. 6b), causing the flat zone 601 to be at the uppermost position of the wafer 600. In such an orientation, a tertiary ion implantation process is performed under the same process conditions as the primary and secondary ion implantation processes.

Figure 6D:
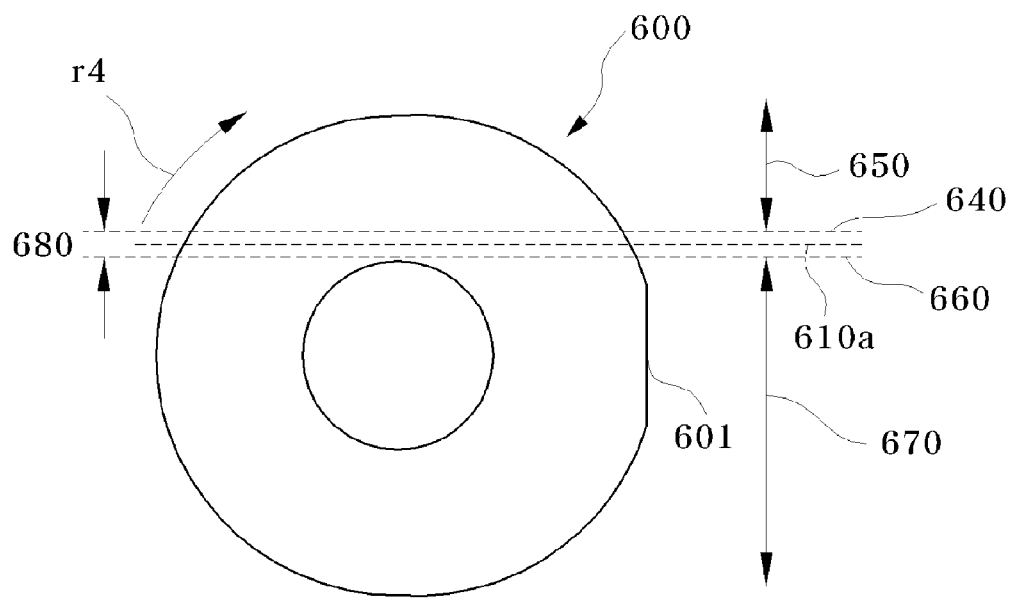

Referring to FIG. 6d, after completing the tertiary ion implantation process, the wafer 600 is rotated 90° clockwise (designated by arrow r3 of FIG. 6c), causing the flat zone 601 to be at the rightmost position of the wafer 600. In such an orientation, a quaternary ion implantation process is performed under the same process conditions as the primary, secondary, and tertiary ion implantation processes.

After completing the quaternary ion implantation process, the wafer 600 is rotated 90° clockwise (designated by arrow r4 of FIG. 6d), causing the flat zone 601 to return to the original lowermost position of the wafer 600. It should be understood that the primary to quaternary ion implantation processes may be performed by repeatedly revolving the wafer 600, although the present embodiment has described the wafer 600 as being rotated by only an angular range of 360°. Further, instead of intermittently rotating the wafer 600 at an interval of 90°, the wafer 600 may be rotated less than 90° or between 90° and 180°. Correspondingly, it is natural that the number of ion implantation processes increases or decreases in proportion to the rotating angle of the wafer 600.

Figure 7:
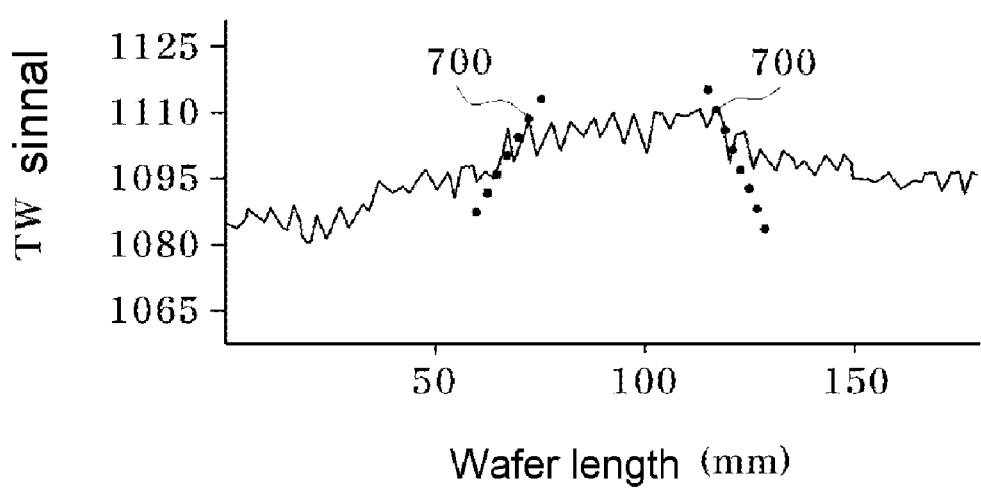
FIG. 7 is a graph illustrating the density distribution of dopant ions implanted by the partial implantation method according to the second disclosed method.

FIG. 7 is a graph illustrating the density distribution of dopant ions implanted by the partial implantation method according to the second disclosed method. It will be understood that the density of the dopant ions implanted in the first region 620 of the wafer 600 is higher than the density of the dopant ions implanted in the second region 630 of the wafer 600. The slope of dotted lines 700, that represents the density distribution of dopant ions at an interface between the first and second regions 620 and 630, namely, in the vicinity of the boundary line 610, is determined depending on the way in which the first and second implantation zones 650 and 670 are defined, namely, distances from the standard dashed line 610a to the first and second dashed lines 640 and 660. The shorter the distance between the first or second dashed lines 640 or 660 and the standard dashed line 610a the higher the slope of the dotted lines 700. Conversely, the farther the distance between the first or second dashed lines 640 or 660 and the standard dashed line 610a, the lower the slope of the dotted lines 700.

Figure 8:
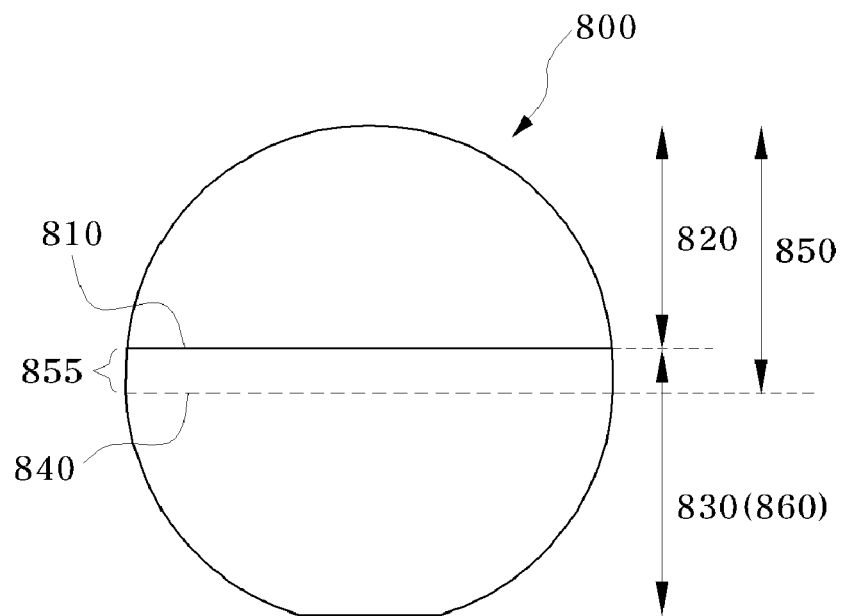
FIG. 8 is a diagram explaining a partial implantation method according to a third disclosed method.

FIG. 8 is a diagram explaining a partial implantation method according to a third disclosed method. A wafer 800 is divided into a plurality of regions according to the density of the dopant ions to be implanted thereto. More specifically, based on a boundary line 810 crossing the center thereof, the wafer 800 is divided into a first region 820 at the upper side of the boundary line 810 and a second region 830 at the lower side of the boundary line 810. A first implantation zone 850 occupies part of the first region 820 and a specific part of the second region 830 close to the boundary line 810. The border of the first implantation zone 850 is indicated by dashed line 840. The area of the first implantation zone 850 is determined depending on the density distribution of the dopant ions in the vicinity of the boundary line 810. In the present embodiment, the area of the first implantation zone 850 is determined to be approximately 110% of the area of the first region 820. A second implantation zone 860 has an area equal to that of the second region 830. Consequently, part of the first implantation zone 850 is overlapped with part of the second implantation zone 860, thereby producing an overlapped zone 855. The overlapped zone 855 is positioned in the second region 830 close to the boundary line 810.

After the first and second implantation zones 850 and 870 are defined, dopant ions are first implanted in the first implantation zone 850 by means of an ion implantation mask, and subsequently, dopant ions are implanted into the second implantation zone 860. As a result, the ions are implanted dually into the overlapped zone 855 of the first and second implantation zones 850 and 860. In this case, the density of the dopant ions implanted in the first implantation zone 850 is lower than the density of the dopant ions implanted in the second implantation zone 860. In the present embodiment, such a density difference between the dopant ions implanted in the first and second implantation zones 850 and 860 is approximately 5%.

Figure 9:
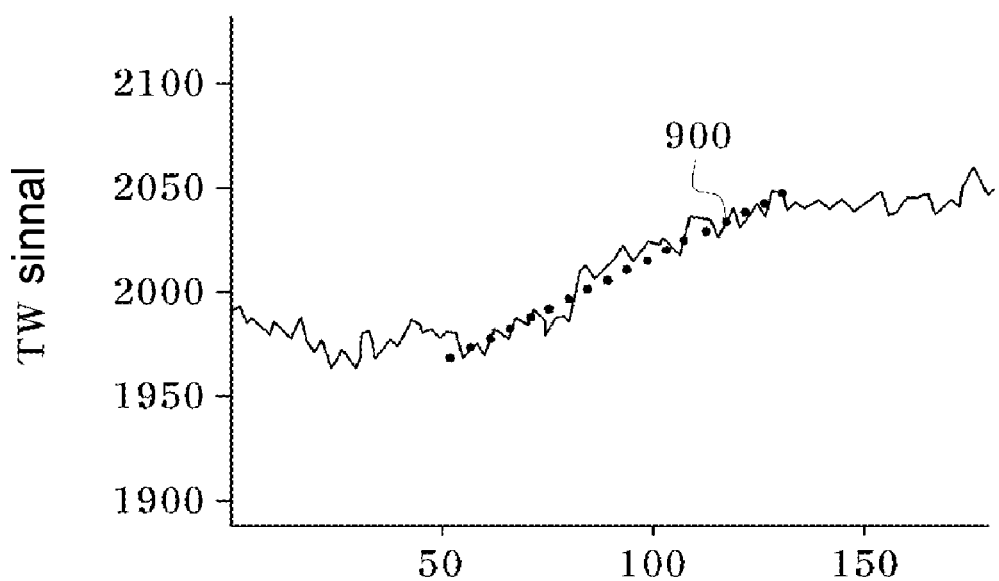
FIG. 9 is a graph illustrating the density distribution of dopant ions implanted by the partial implantation method according to the third disclosed method.

FIG. 9 is a graph illustrating the density distribution of the dopant ions implanted by the partial implantation method according to the third disclosed method. It will be understood that the density of dopant ions implanted in the first region 820 is lower than that of the second region 830. Further, the slope of a dotted line 900, that represents the density distribution of the dopant ions in the vicinity of the boundary line 810, is relatively low because the ion implantation process is performed in a state wherein the first and second regions 820 and 830 overlap in the vicinity of the boundary line 810. When it is desired to lower the slope of the dotted line 900, it is desirable to increase the area of the overlapped zone 855 of the first and second implantation zones 850 and 860.

Figure 10:
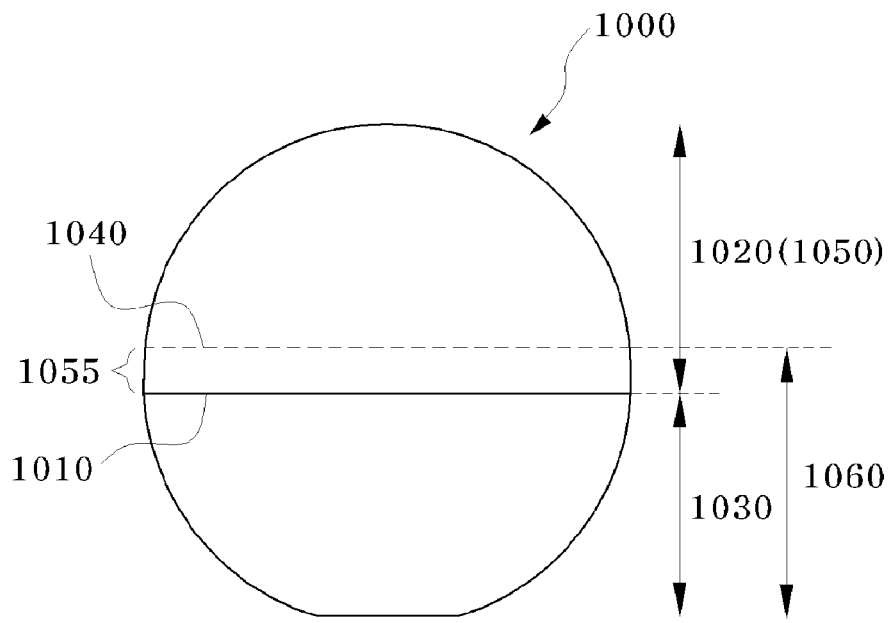
FIG. 10 is a diagram explaining an alternative partial implantation method according to the third disclosed method.

FIG. 10 is a diagram explaining an alternative partial implantation method according to the third disclosed method. A wafer 1000 is divided into a plurality of regions according to the density of dopant ions to be implanted thereto. More specifically, based on a boundary line 1010 crossing the center thereof, the wafer 1000 is divided into a first region 1020 at the upper side of the boundary line 1010 and a second region 1030 at the lower side of the boundary line 1010. A first implantation zone 1050 has an area equal to that of the first region 1020. A second implantation zone 1060 occupies part of the second region 1030 and a specific part of the first region 1020 close to the boundary line 1010. The border of the second implantation zone 1060 is indicated by dashed line 1040. The area of the second implantation zone 1060 is determined depending on the density distribution of dopant ions in the vicinity of the boundary line 1010. In the present embodiment, the area of the second implantation zone 1060 is determined to be approximately 110% of the area of the second region 1030. Consequently, part of the second implantation zone 1060 is overlapped with part of the first implantation zone 1050, thereby producing an overlapped zone 1055. The overlapped zone 1055 is positioned in the first region 1020 close to the boundary line 1010.

After the first and second implantation zones 1050 and 1060 are defined, dopant ions are first implanted in the first implantation zone 1050 by means of an ion implantation mask, and subsequently, dopant ions are implanted into the second implantation zone 1060. As a result, the ions are implanted dually in the overlapped zone 1055 of the first and second implantation zones 1050 and 1060. In this case, the density of the dopant ions implanted in the first implantation zone 1050 is lower than the density of the dopant ions implanted in the second implantation zone 1060. In the present embodiment, such a density difference between the dopant ions implanted in the first and second implantation zones 1050 and 1060 is approximately 5%. The density distribution of the dopant ions, obtained by performing the ion implantation process using the partial implantation method described above, is similar to that shown in the graph of FIG. 9.

Figure 11:
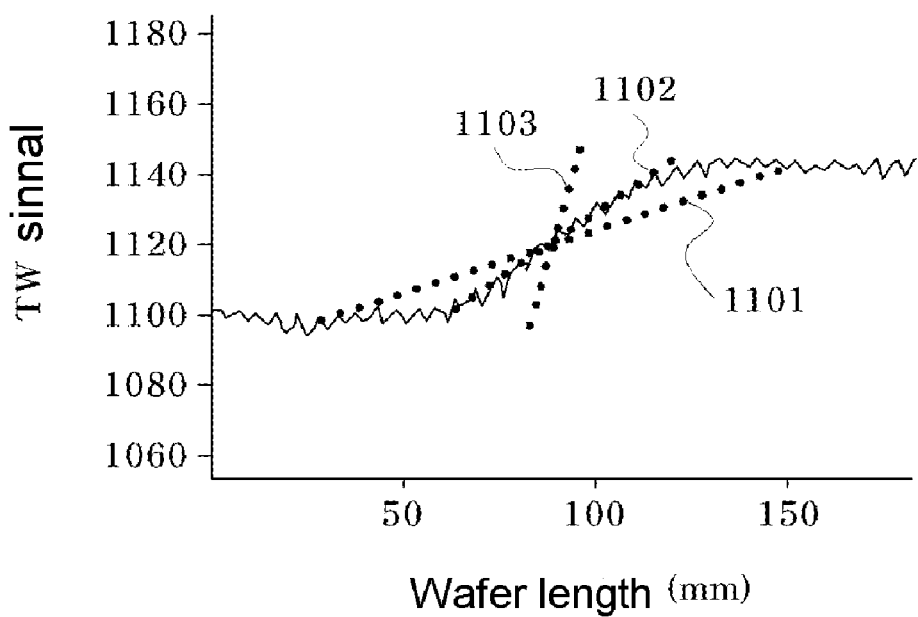
FIG. 11 is a graph explaining the adjustment of the density distribution in the vicinity of a boundary line according to the third disclosed method.

FIG. 11 is a graph explaining the adjustment of density distribution in the vicinity of the boundary line according to the third disclosed method. The density distribution of dopant ions in the vicinity of the boundary line of the wafer can be adjusted to provide a dotted line 1101 having a lowest slope, a dotted line 1102 having an intermediate slope, and a dotted line 1103 having a highest slope. The slope of the dotted line 1102 can be adjusted by varying the area of the overlapped zone of the first and second implantation zones. The larger the area of the overlapped zone of the first and second implantation zones, the lower the slope of the dotted line that represents the density distribution of dopant ions. The dotted line 1101 of the lowest slope is obtained when the first and second implantation zones overlap by a large area, while the dotted line 1103 of the highest slope is obtained when the first and second implantation zones overlap by a small area.

FIGS. 12*a* to 12*d* are diagrams explaining a partial implantation method according to a fourth disclosed method. The partial implantation method according to the fourth disclosed method involves a plurality of ion implantation processes during rotation of a wafer 1200 similar to the previously described second embodiment. In the present embodiment, the wafer 1200 is divided into a plurality of regions according to the density of dopant ions to be implanted thereto. That is, based on a circular boundary line 1210, the wafer 1200 is divided into first and second regions. The first region of the wafer 1200 is a peripheral region 1020 outside the circular boundary line 1210, and the second region of the wafer 1200 is a center region 1230 inside the circular boundary line 1210.

Next, the wafer 1200 is oriented with a flat zone 1201 at the lowermost position thereof. In such an orientation, a first implantation zone 1250 is defined at the upper side of a dashed line 1240, that is displaced downward from a standard dashed line 1210*a* as a tangent line of the circular boundary line 1210 by a predetermined distance in parallel thereto. A second implantation zone 1260 is defined at the lower side of the standard dashed line 1210*a*.

After the first and second implantation zones 1250 and 1260 are defined, a primary ion implantation process for threshold voltage adjustment is performed in the first and second implantation zones 1250 and 1260 by means of an ion implantation mask. The primary ion implantation process is divided into an ion implantation step associated with the first implantation zone 1250 and an ion implantation step associated with the second implantation zone 1260. To the first and second implantation zones 1250 and 1260 are implanted dopant ions with different densities. The density of dopant ions to be implanted in the first implantation zone 1250 is determined to be lower than the density of the dopant ions to be implanted in the second implantation zone 1260. More specifically, although the density of dopant ions to be implanted may be varied depending on the desired threshold voltage value, the density difference of the dopant ions implanted in the first and second implantation zones 1250 and 1260 is approximately 5%.

Figure 12A:
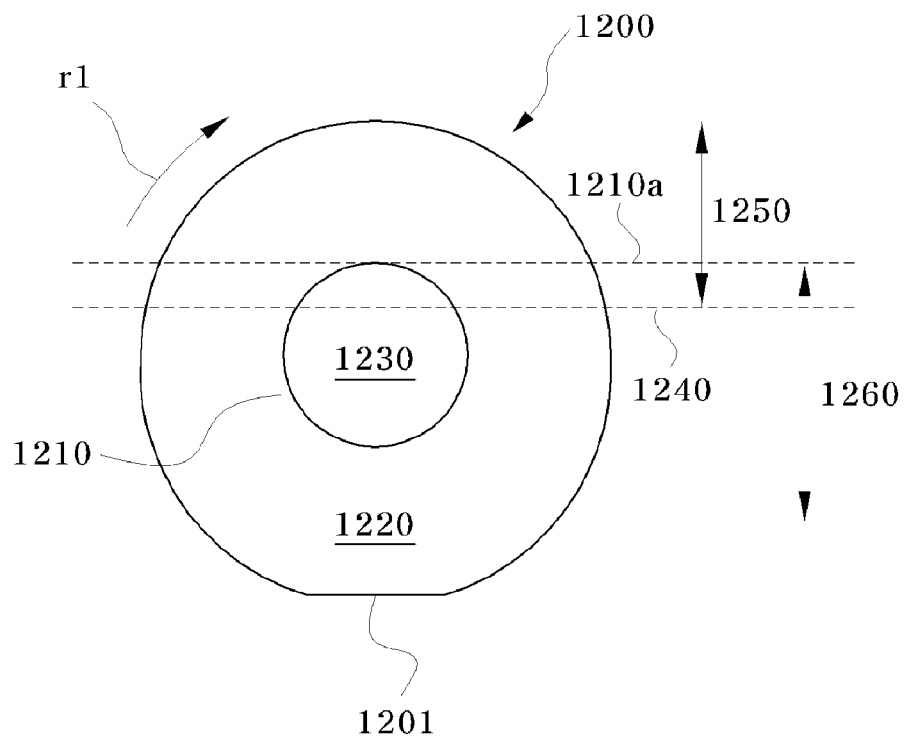
FIGS. 12a to 12d are diagrams explaining a partial implantation method according to a fourth disclosed method.
Figure 12B:
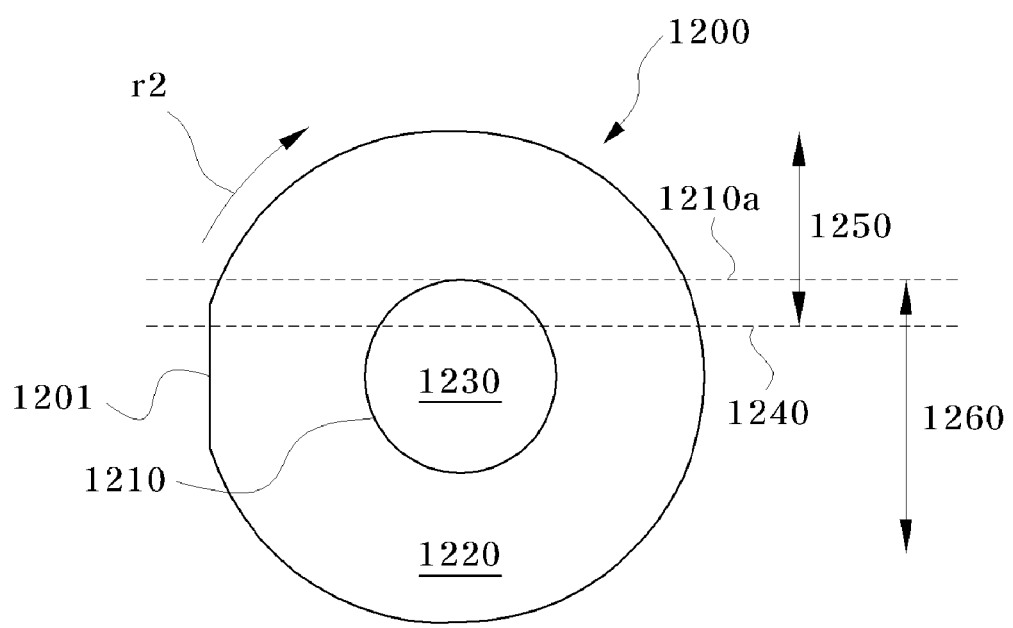

Referring to FIG. 12*b*, after completing the primary ion implantation process, the wafer 1200 is rotated 90° clockwise (designated by arrow r1 of FIG. 12*a*), causing the flat zone 1201 to be the leftmost position of the wafer 1200. In such an orientation, a secondary ion implantation process is performed under the same process conditions as the primary ion implantation process. That is, the dopant ions are implanted into the first and second implantation zones 1250 and 1260 so that the density of the dopant ions implanted in the first implantation zone 1250 is lower than the density of the dopant ions implanted in the second implantation zone 1260 by approximately 5%.

Figure 12C:
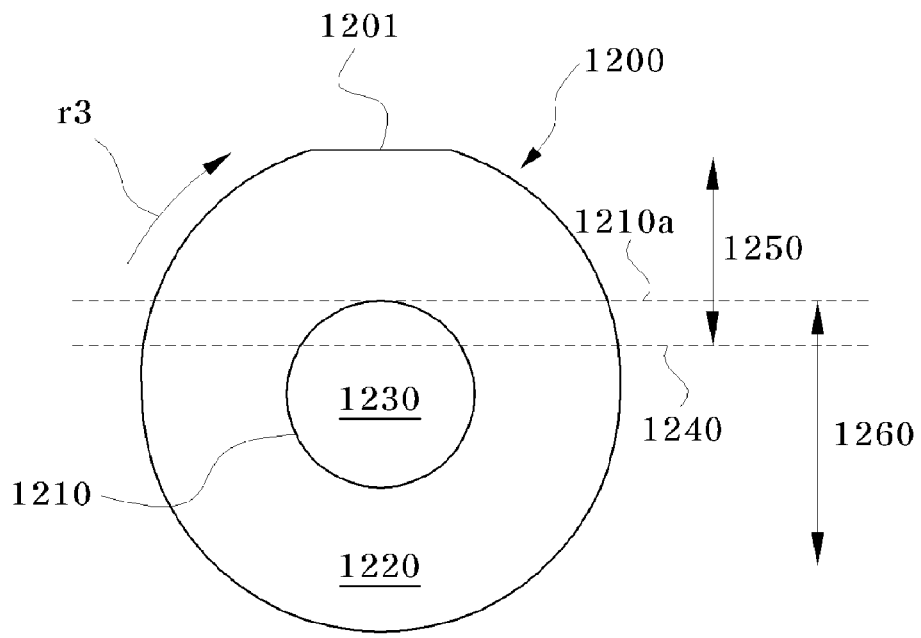

Referring to FIG. 12*c*, after completing the secondary ion implantation process, the wafer 1200 is rotated 90° clockwise (designated by arrow r2 of FIG. 12*b*), causing the flat zone 1201 to be the uppermost position of the wafer 1200. In such an orientation, a tertiary ion implantation process is performed under the same process conditions as the primary and secondary ion implantation processes.

Figure 12D:
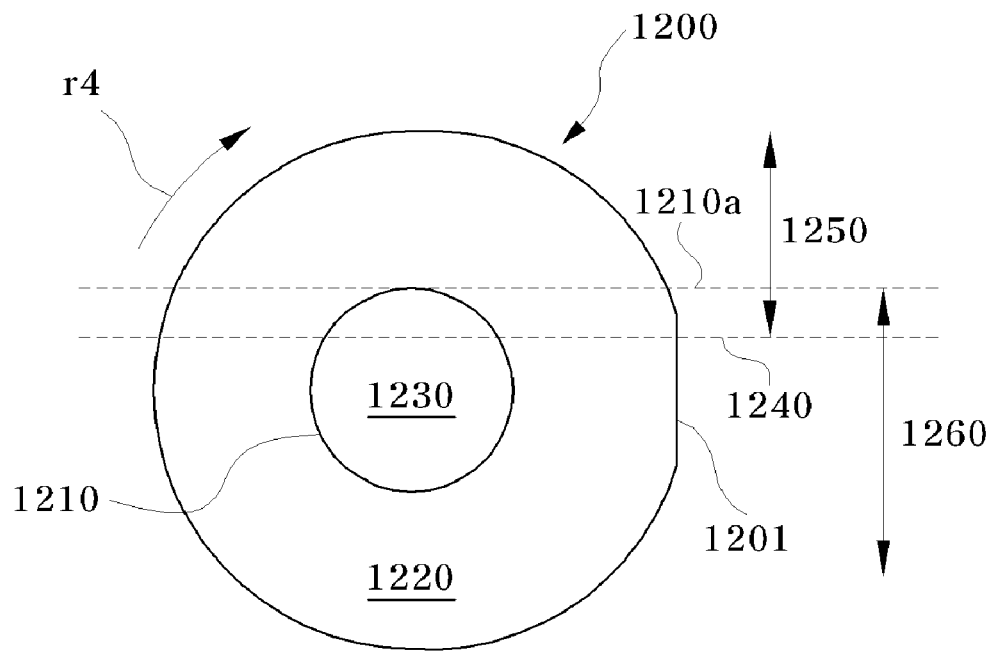

Referring to FIG. 12*d*, after completing the tertiary ion implantation process, the wafer 1200 is rotated 90° clockwise (designated by arrow r3 of FIG. 12*c*), causing the flat zone 1201 to be the rightmost position of the wafer 1200. In such an orientation, a quaternary ion implantation process is performed under the same process conditions as the primary, secondary and tertiary ion implantation processes.

After completing the quaternary ion implantation process, the wafer 1200 is rotated 90° clockwise (designated by arrow r4 of FIG. 12*d*), causing the flat zone 1201 to return to its original lowermost position. It should be understood that the primary to quaternary ion implantation processes may be performed by repeatedly revolving the wafer 1200, although the present embodiment has described the wafer 1200 as being rotated by only an angular range of 360°. Further, instead of intermittently rotating the wafer 1200 at an interval of 90°, the wafer 600 may be rotated less than 90° or between 90° and 180°. Correspondingly, it is natural that the number of the ion implantation processes increases or decreases in proportion to the rotating angle of the wafer 1200.

Figure 13:
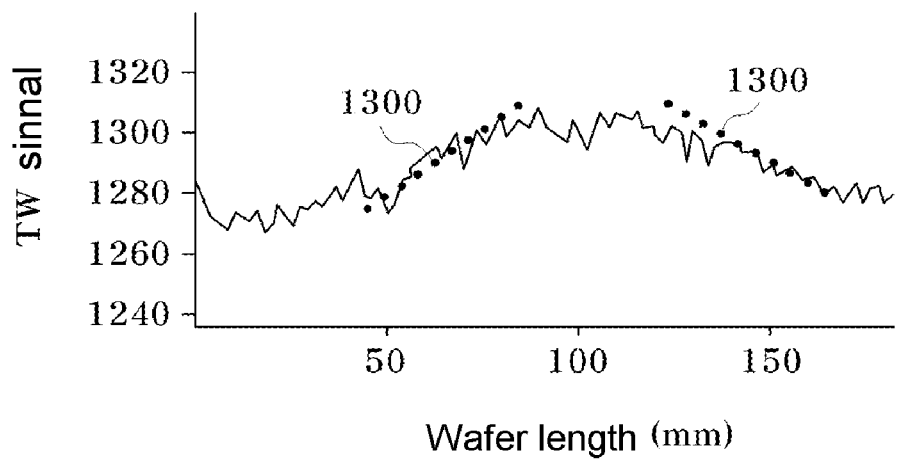
FIG. 13 is a graph illustrating the density distribution of dopant ions implanted by the partial implantation method according to the fourth disclosed method.

FIG. 13 is a graph illustrating the density distribution of dopant ions implanted by the partial implantation method according to the fourth disclosed method. Along with FIGS. 12a to 12d, it can be understood that the density of the dopant ions in the first region 1220 of the wafer 1200 is higher than the density of dopant ions in the second region 1230. The slope of dotted lines 1300, that represents the density distribution of dopant ions at an interface between the first and second regions 1220 and 1230, namely, in the vicinity of the boundary line 1210, is determined depending on the way in which the first and second implantation zones 1250 and 1260 are defined, and a distance between the standard dashed line 1210a and the dashed line 1240, namely, the area of the overlapped region of the first and second implantation zones 1250 and 1260. The smaller the area of the overlapped region of the first and second implantation zones 1250 and 1260, the higher the slope of the dotted lines 1300. Conversely, the larger the area of the overlapped region of the first and second implantation zones 1250 and 1260, the lower the slope of the dotted lines 1300.

FIGS. 14a to 14d are diagrams explaining an alternative partial implantation method of the fourth disclosed method. The partial implantation method according to the fourth disclosed method is similar to that described with reference to FIGS. 12a to 12d, except for the way in which first and second implantation zones 1450 and 1460 are defined. More specifically, based on a circular boundary line 1410, a wafer 1400 is divided into a first region 1420 that is a peripheral region outside the boundary line 1410, and a second region 1430 that is a center region inside the boundary line 1410.

Next, the wafer 1400 is oriented with a flat zone 1401 at the lowermost position thereof. In such an orientation, a first implantation zone 1450 is defined at the upper side of a standard dashed line 1440 as a tangent line of the circular boundary line 1410. A second implantation zone 1460 is defined at the lower side of a dashed line 1410a that is displaced upward from standard dashed line 1440 as the tangent line of the circular boundary line 1410 by a predetermined distance in parallel thereto.

After the first and second implantation zones 1450 and 1460 are defined, a primary ion implantation process for threshold voltage adjustment is performed on the first and second implantation zones 1450 and 1460 by means of an ion implantation mask. The primary ion implantation process is divided into an ion implantation step associated with the first implantation zone 1450 and an ion implantation step associated with the second implantation zone 1460. Ions are implanted into the first and second implantation zones 1450 and 1460 at different densities. That is, the density of dopant ions to be implanted in the first implantation zone 1450 is determined to be lower than the density of dopant ions to be implanted in the second implantation zone 1460. More specifically, although the density of dopant ions to be implanted may be varied depending upon the desired threshold voltage value, the density difference of dopant ions implanted in the first and second implantation zones 1450 and 1460 is approximately 5%.

Figure 14A:
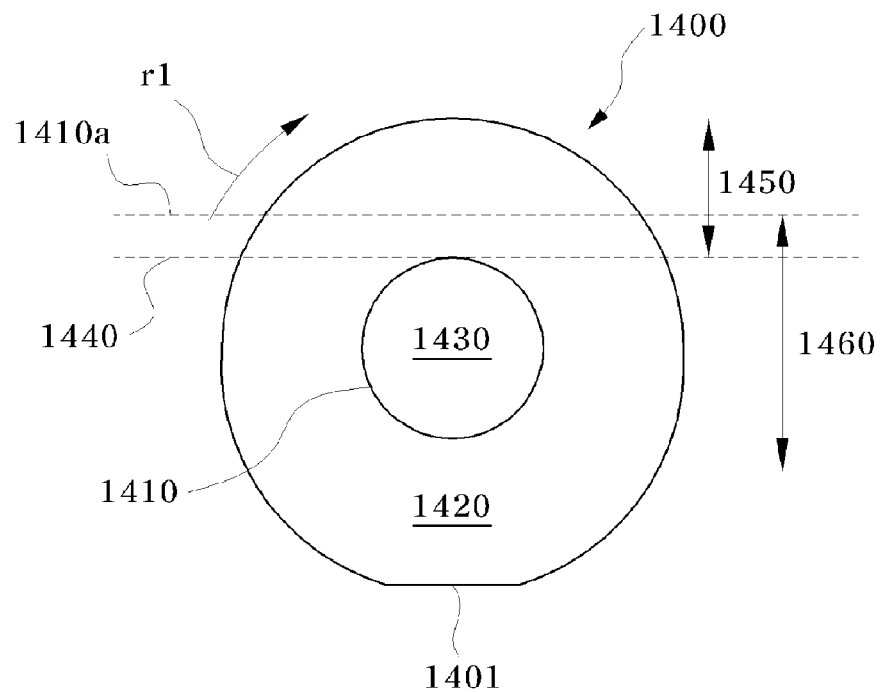
FIGS. 14a to 14d are diagrams explaining an alternative partial implantation method of the fourth disclosed method.
Figure 14B:
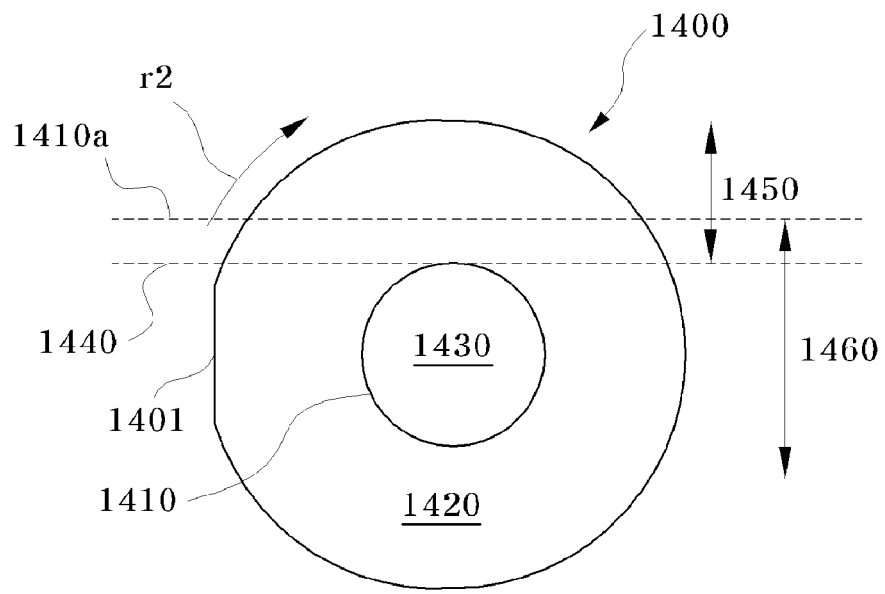

Referring to FIG. 14b, after completing the primary ion implantation process, the wafer 1400 is rotated 90° clockwise (designated by arrow r1 of FIG. 14a), causing its flat zone 1401 to be at the leftmost position of the wafer 1400. In such an orientation, a secondary ion implantation process is performed under the same process conditions as the primary ion implantation process. That is, dopant ions are implanted into the first and second implantation zones 1450 and 1460 so that the density of dopant ions to be implanted in the first implantation zone 1450 is lower than the density of dopant ions to be implanted in the second implantation zone 1460 by approximately 5%.

Figure 14C:
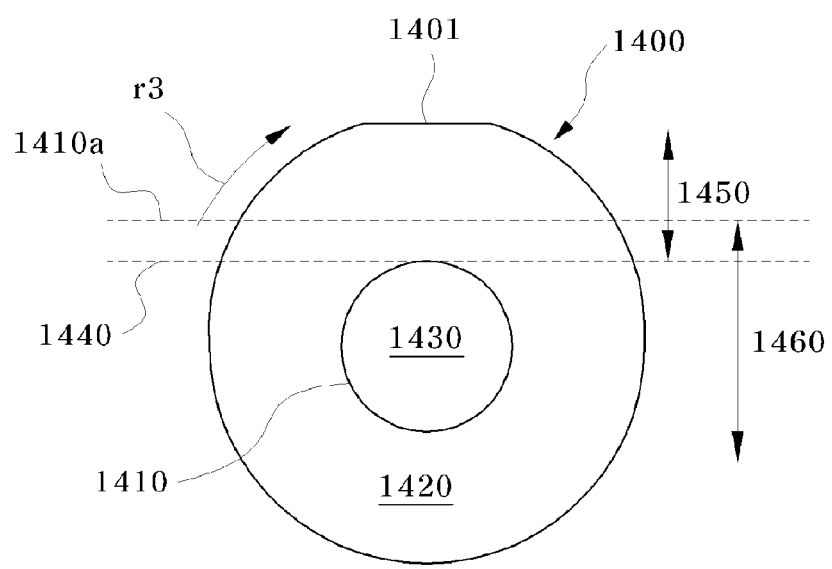

Referring to FIG. 14c, after completing the secondary ion implantation process, the wafer 1400 is rotated 90° clockwise (designated by arrow r2 of FIG. 14b), causing the flat zone 1401 to be at the uppermost position of the wafer 1400. In such an orientation, a tertiary ion implantation process is performed under the same process conditions as the primary and secondary ion implantation processes.

Figure 14D:
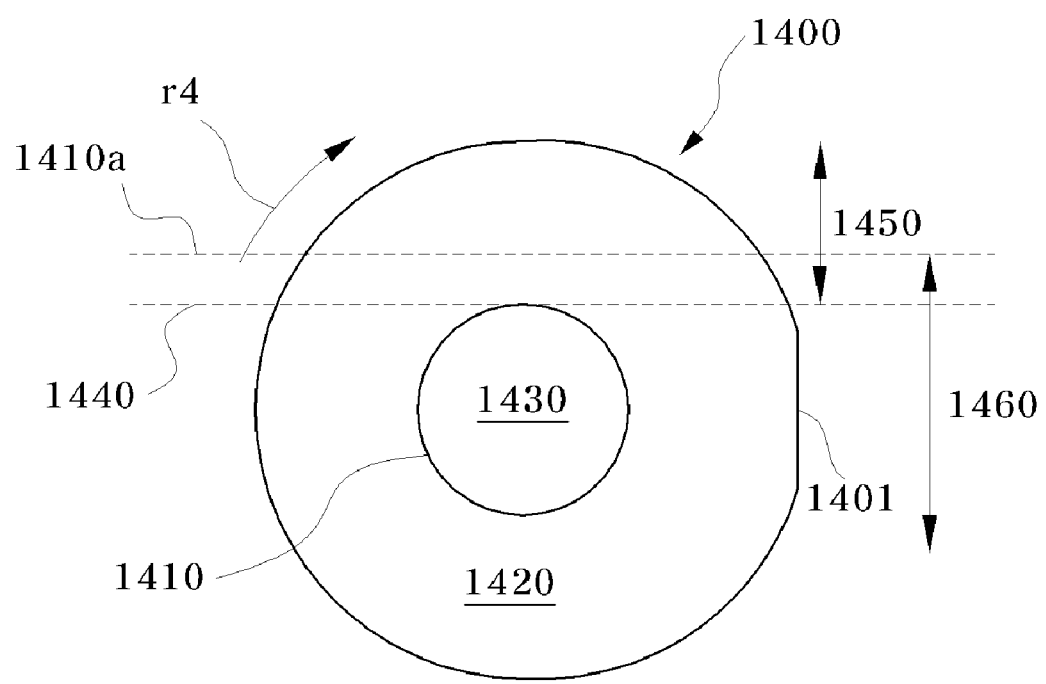

Referring to FIG. 14d, after completing the tertiary ion implantation process, the wafer 1400 is rotated 90° clockwise (designated by arrow r3 of FIG. 14c), causing the flat zone 1401 to be in the rightmost position of the wafer 1400. In such an orientation, a quaternary ion implantation process is performed under the same process conditions as the primary, secondary, and tertiary ion implantation processes.

After completing the quaternary ion implantation process, the wafer 1400 is rotated 90° clockwise (designated by arrow r4 of FIG. 14d), causing the flat zone 1401 to return to its original lowermost position. It should be understood that the primary to quaternary ion implantation processes may be performed while repeatedly revolving the wafer 1400, although the present embodiment has described the wafer 1400 as being rotated by only an angular range of 360°. Further, instead of intermittently rotating the wafer 1400 by an interval of 90°, the wafer 600 may be rotated less than 90° or between 90° and 180°. Correspondingly, it is natural that the number of the ion implantation processes increases or decreases in proportion to the rotating angle of the wafer 1400. The density distribution of the dopant ions, obtained by performing the ion implantation process using the partial implantation method described above, is similar to that shown in the graph of FIG. 9.

As apparent from the above description, the disclosed methods provide a partial implantation method for manufacturing semiconductor devices which comprises the steps of dividing a wafer into a plurality of regions according to the density of dopant ions to be implanted thereto, defining a plurality of ion implantation zones in the respective regions of the wafer so that they are spaced apart from a boundary line of the respective regions or overlap each other, and performing ion implantation processes on the respective ion implantation zones, thereby enabling the adjustment of a slope that represents the density distribution of dopant ions in the vicinity of the boundary line between the respective regions of the wafer.

Although the preferred methods have been disclosed for illustrative purposes, those skilled in the art will appreciate that various modifications, additions and substitutions are possible, without departing from the scope and spirit of this disclosure and the accompanying claims.

What is claimed is:

1. A partial implantation method to implant dopant ions at different densities into a center region and a peripheral region defined in a wafer by means of a circular boundary line, the method comprising:

defining a first region at an upper side of a horizontal line as a tangent line of the circular boundary line and a second region at a lower side of the horizontal line;

implanting dopant ions at a first density into a first implantation zone as a remaining part of the first region except for a specific part of the first region close to the horizontal line, at a second density different from the first density into a second implantation zone as a remaining part of the second region except for a specific part of the second region close to the horizontal line, and at a third density between the first and second densities into a third implantation zone as remaining part of the wafer except for the first and second implantation zones; and repeatedly implanting the ions while intermittently rotating the wafer within an angular range of 360°, wherein a slope of the density of dopants in the third implantation zone can be adjusted by varying the area of a least one of the first and second implantation zones.

2. The method as set forth in claim 1, wherein the repeated implanting of the ions while intermittently rotating the wafer is performed until the wafer is rotated beyond at least the angular range of 360°.

3. The method as set forth in claim 1, wherein the wafer is intermittently rotated by an angle of less than 180° during the implantation of the dopant ions.

4. The method as set forth in claim 1, wherein the first implantation zone has an area corresponding to about 98% of the area of the first region.

5. The method as set forth in claim 1, wherein the second implantation zone has an area corresponding to about 98% of the area of the second region.

6. The method as set forth in claim 1, wherein:
the first density of the dopant ions implanted in the first implantation zone is lower than the third density of the dopant ions implanted in the third implantation zone; and the second density of the dopant ions implanted in the second implantation zone is higher than the third density of the dopant ions implanted in the third implantation zone.

7. The method as set forth in claim 6, wherein:
the first density is lower than the third density by about 5%; and the second density is higher than the third density by about 5%.

* * * * *